United States Patent
Chiu et al.

(10) Patent No.: US 9,331,154 B2
(45) Date of Patent: May 3, 2016

(54) HIGH ELECTRON MOBILITY TRANSISTOR

(71) Applicants: EPISTAR CORPORATION, Hsinchu (TW); HUGA OPTOTECH, INC, Hsinchu (TW)

(72) Inventors: Hsien-Chin Chiu, Taichung (TW); Chien-Kai Tung, Taichung (TW); Heng-Kuang Lin, Taichung (TW); Chih-Wei Yang, Taichung (TW); Hsiang-Chun Wang, Taichung (TW)

(73) Assignees: EPISTAR CORPORATION, Hsinchu (TW); HUGA OPTOTECH, INC, Hsinchu (TW)

( * ) Notice: Subject to any disclaimer, the term of this patent is extended or adjusted under 35 U.S.C. 154(b) by 0 days.

(21) Appl. No.: 14/328,241

(22) Filed: Jul. 10, 2014

(65) Prior Publication Data

US 2015/0054034 A1 Feb. 26, 2015

Related U.S. Application Data

(60) Provisional application No. 61/868,423, filed on Aug. 21, 2013.

(51) Int. Cl.
  *H01L 29/66* (2006.01)
  *H01L 29/20* (2006.01)
  *H01L 29/417* (2006.01)
  *H01L 29/423* (2006.01)
  *H01L 29/778* (2006.01)

(52) U.S. Cl.
  CPC ...... *H01L 29/2003* (2013.01); *H01L 29/41758* (2013.01); *H01L 29/42316* (2013.01); *H01L 29/7787* (2013.01)

(58) Field of Classification Search
  USPC ........... 257/194, E29.246, E29.247, E29.248, 257/E29.252, E21.103, E21.407
  See application file for complete search history.

(56) References Cited

U.S. PATENT DOCUMENTS

2013/0228789 A1* 9/2013 Yamamura ...................... 257/76

* cited by examiner

*Primary Examiner* — Timor Karimy
(74) *Attorney, Agent, or Firm* — Patterson & Sheridan, LLP

(57) ABSTRACT

A high electron mobility transistor comprises a substrate, an epitaxial stack arranged above the substrate and having a first region and a second region surrounding the first region, a matrix electrode structure arranged in the first region, and a plurality of first bridges electrically connecting the plurality of second electrodes. The matrix electrode structure comprises a plurality of first electrodes arranged on the epitaxial stack and a plurality of second electrodes arranged on the epitaxial stack and adjacent to the plurality of first electrodes. One of the bridges is arranged between two of the second electrodes and crossed over one of the first electrodes.

18 Claims, 11 Drawing Sheets

HIGH ELECTRON MOBILITY TRANSISTOR

TECHNICAL FIELD

This application claims the benefit of provisional application No. 61/868,423 filed Aug. 21, 2013; the contents of which are incorporated herein by reference in their entirety.

BACKGROUND OF THE DISCLOSURE

This present application relates to a high electron mobility transistor (HEMT), and more particularly to a high electron mobility transistor with an air-bridge matrix (ABM) electrode structure.

The AlGaN/GaN high-electron mobility transistor (HEMT) is a promising candidate for the next generation of high-power devices. They can maintain robust device characteristics at high temperatures and high voltage conditions because of their superior material properties. Particular attention has been drawn to Schottky barrier diodes (SBDs) and field effect transistors (FETs).

GaN on Si (111) technology is getting popular in electronic devices because of its low cost and superior scalability of large wafer size. However, there is an obvious thermal effect observed from the GaN HEMTs on Si substrate due to the current crowding when being operated at high voltage condition.

SUMMARY OF THE DISCLOSURE

A high electron mobility transistor comprises a substrate, an epitaxial stack arranged above the substrate and having a first region and a second region surrounding the first region, a matrix electrode arranged in the first region, and a plurality of first bridges electrically connecting the plurality of second electrodes. The matrix electrode structure comprises a plurality of first electrodes arranged on the epitaxial stack and a plurality of second electrodes arranged on the epitaxial stack and adjacent to the plurality of first electrodes. One of the bridges is arranged between two of the second electrodes and crossed over one of the first electrodes.

DETAILED DESCRIPTION OF THE PREFERRED EMBODIMENTS

Figure 1:
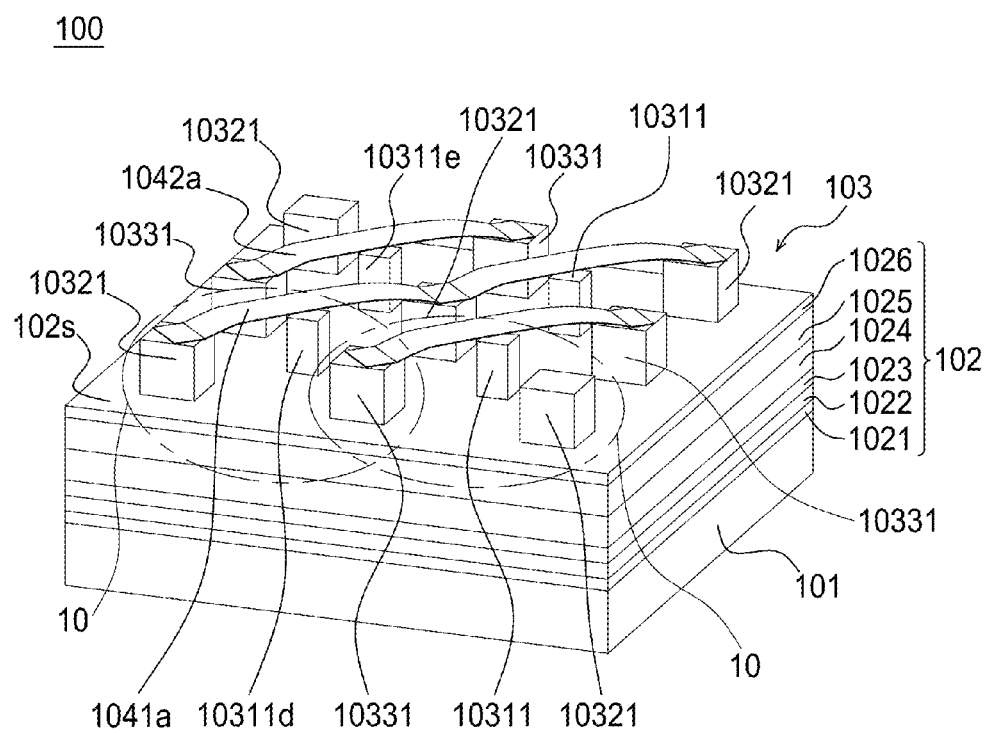
FIG. 1 shows a high-electron mobility transistor in accordance with a first embodiment of the present disclosure.

The embodiment of the application is illustrated in detail, and is plotted in the drawings. The same or the similar part is illustrated in the drawings and the specification with the same number.

FIG. 1 shows a high-electron mobility transistor in accordance with a first embodiment of the present disclosure. The high-electron mobility transistor 100 comprises a plurality of small FETs 10 (filed effect transistors), wherein the small FETs 10 are in parallel connection. The high-electron mobility transistor 100 comprises a substrate 101, an epitaxial stack 102 formed on the substrate 101, and a matrix electrode structure 103 formed on the epitaxial stack 102. The epitaxial stack 102 comprises a first semiconductor layer 1021, a second semiconductor layer 1022, a third semiconductor layer 1023, a channel layer 1024, a supplying layer 1025, and a cap layer 1026 grown on the substrate 101 in sequences.

The substrate 101 may be made of a material suitable for growing nitride semiconductor, such as Si, SiC, GaN or sapphire. The first semiconductor layer 1021 having a thickness of 150~200 nm can be a nucleation layer and comprises III-V materials, such as MN. When Si substrate is used, the nucleation layer is formed on the [111] plane of the Si substrate and grows in (0001) direction in order to reduce difference of lattice constant between the Si substrate and the epitaxial stack so the quality of the epitaxial stack is improved. The second semiconductor layer 1022 having a thickness range between 700~800 nm can be a grading layer or a superlattice structure and made of III-V material, such as a AlGaN grading layer or a AlGaN/AlN superlattice structure. The third semiconductor layer 1023 having a thickness range between 1~4 μm can be a buffer layer and comprises III-V materials, such as GaN.

The channel layer 1024 having a thickness range between 50~300 nm is formed on the third semiconductor layer 1023 and has a first band gap. The supplying layer 1025 having a thickness range between 20~50 nm is formed on the channel layer 1024 and has a second band gap which is larger than the first band gap of the channel layer 1024, which means the lattice constant of the supplying layer 1025 is smaller than that of the channel layer 1024. In the present embodiment, the channel layer comprises $In_xGa_{(1-x)}N$ wherein 0≤x<1, and supplying layer 1025 comprises $Al_yIn_zGa_{(1-z)}N$ wherein 0<y<1, 0≤z<1. The channel layer 1024 and the supplying layer 1025 form the spontaneous polarization by themselves and the piezoelectric polarization by the different lattice constant therebetween, and then a two dimensional electron gas (2DEG) can be generated at a heterostructural interface between the channel layer 1024 and the supplying layer 1025. It should be noted that the channel layer 1024 and the supplying layer 1025 may be intrinsic semiconductor layers. In other embodiments, the channel layer 1024 and the supplying layer 1025 may be doped semiconductor layers and the doping substance may be SiH4 (Silane) in order to increase the effect of the spontaneous polarization and the piezoelectric polarization and raise the 2DEG concentration. The cap layer 1026 having a thickness range between 0.1~3 nm is formed on the supplying layer 1025 and made of III-V material, such as GaN, to maintain the surface state stable and avoid surface damage of the supplying layer 1025 during the manufacturing process.

Figure 2A:
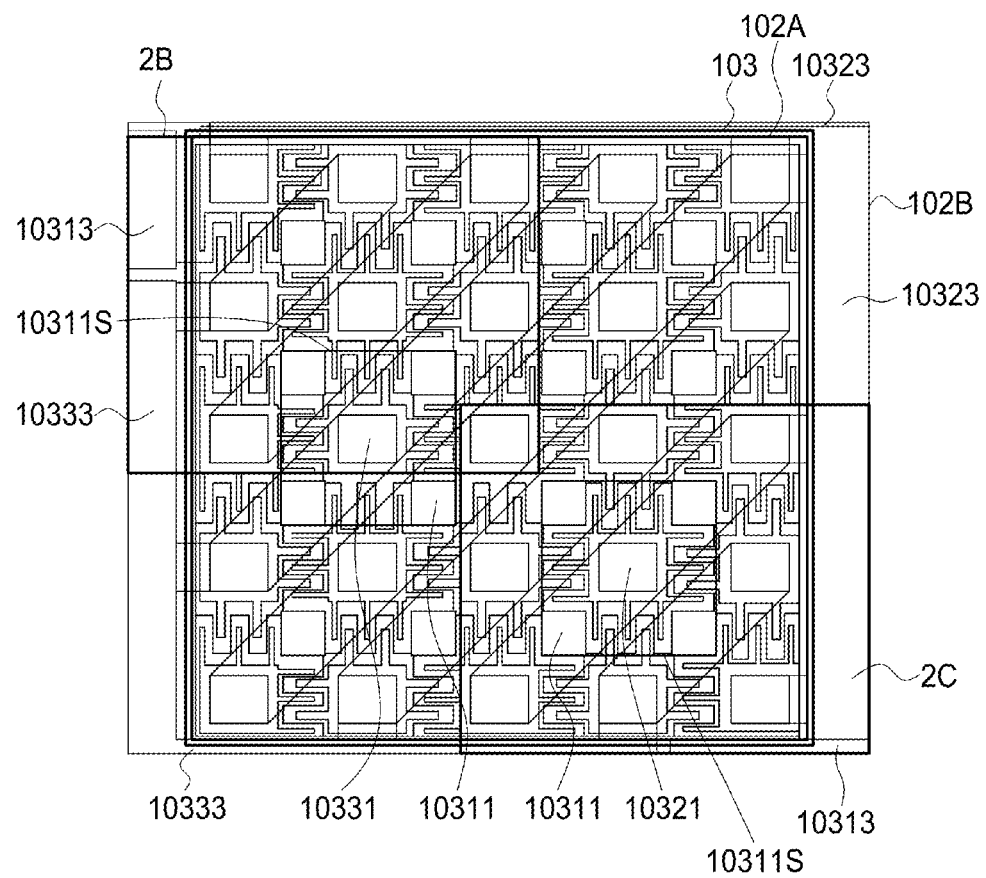
FIG. 2A shows a top view of a high-electron mobility transistor in accordance with a first embodiment of the present disclosure.

FIG. 2A shows a top view of a high-electron mobility transistor in accordance with a first embodiment of the present disclosure. The epitaxial stack 102 has a first region 102A and a second region 102B surrounding the first region 102A. The matrix electrode structure 103 is disposed on the cap layer 102b, arranged in the first region 102A and comprises a plurality of first electrodes 10311, a plurality of second electrodes 10321 adjacent to the plurality of first electrodes 10311, and a plurality of third electrodes 10331 adjacent to the plurality of first electrodes 10311 and second electrodes 10321. In the present embodiment, the plurality of first electrodes 10311 may be gate electrodes and in schottky contact with the epitaxial stack 102, the plurality of second electrodes 10321 may be source electrode and in ohmic contact with the epitaxial stack 102, and the plurality of third electrodes 10331 may be drain electrodes and in ohmic contact with the epitaxial stack 102. A first pad 10313, such as gate bonding pad, electrically connects to the plurality of first electrodes 10311, a second pad 10323, such as source bonding pad, electrically connects to the plurality of second electrodes 10321, and a third pad 10333, such as drain bonding pad, electrically connects to the plurality of third electrodes 10331, wherein the first pad 10313, the second pad 10323 and the third pad 10333 are arranged in the second region 102B. One of the second electrodes 10321 and third electrodes 10331 may be made of stacks of Ti/Al/Ti/Au, Ti/Al/Ni/Au or other metal materials, and one of the electrodes 10311 may be made of a stack of Ni/Au or other metal materials. The first pad 10313, the second pad 10323, and the third pad 10333 are made of metal material, such as Au or Al. As shown in FIG. 2A, several first electrodes 10311 form a geometric shape 10311S, such as a rectangle. The geometric shape 10311S surrounds one of the second electrode 10321 or the third electrode 10331. It should be noted that the plurality of first electrodes 10311 and the plurality of second electrodes 10321 or the plurality of third electrodes 10331 are arranged in different columns or lines.

Figure 2B:
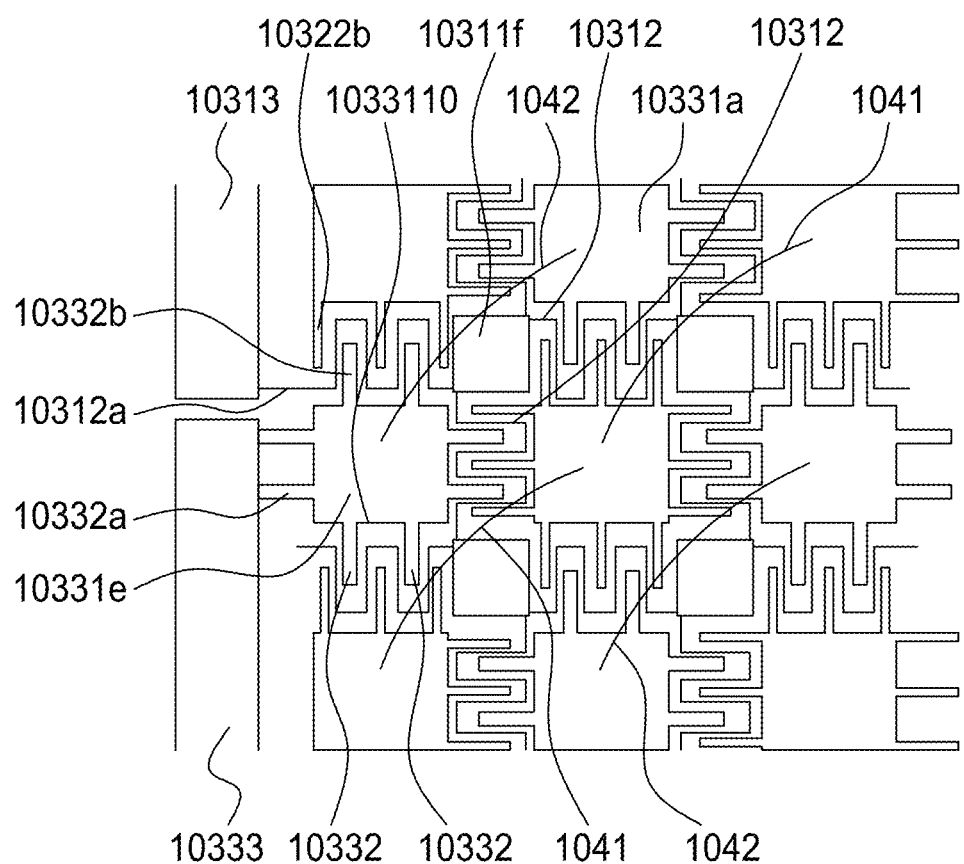
FIGS. 2B~2C show partial enlarged drawings of 2A in accordance with a first embodiment of the present disclosure.
Figure 2C:
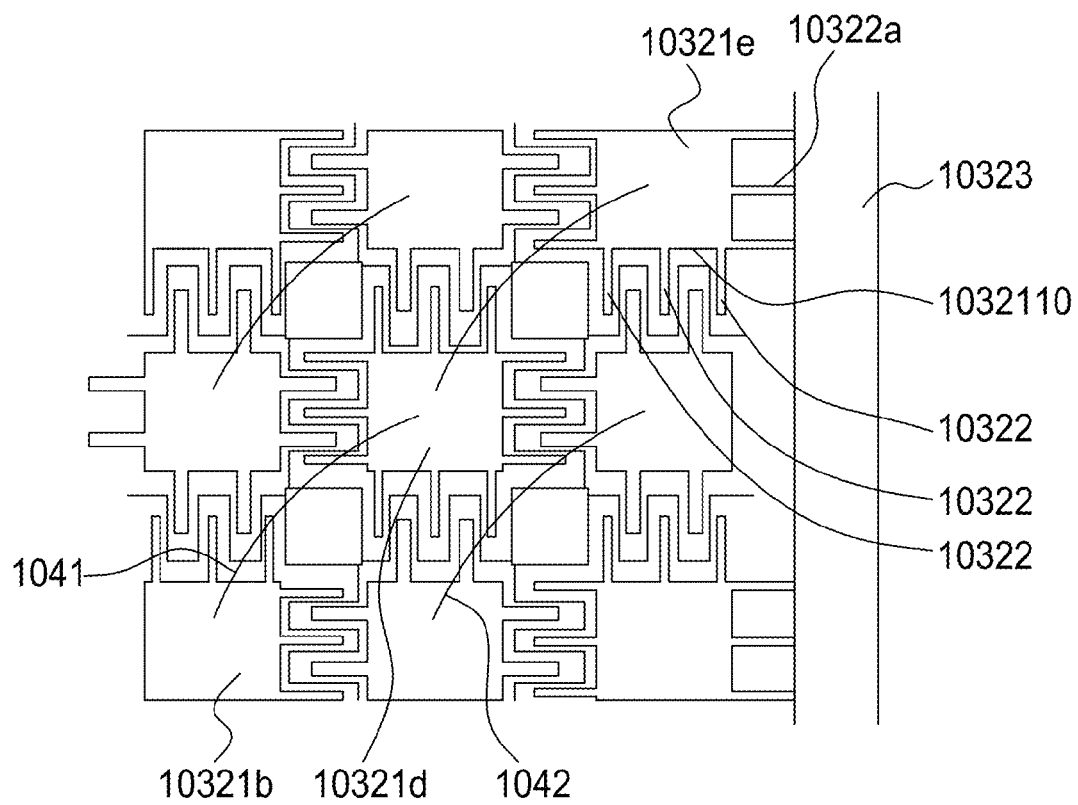

FIGS. 2B and 2C show partial enlarged drawings of 2A in accordance with a first embodiment of the present disclosure. A plurality of first bridges 1041 electrically connects the plurality of second electrodes 10321 and a plurality of second bridges 1042 electrically connects the plurality of third electrodes 10331, wherein the first bridges 1041 and the second bridges 1042 are made of a metal material, like Au. As shown in FIG. 1, the first bridge 1041a is arranged between two of the second electrodes 10321 and crosses over the first electrode 10311d, and the second bridge 1042a is arranged between two of the third electrodes 10331 and crosses over the first electrode 10311e. In the present embodiment, a medium among the first and second bridges 1041, 1042 and a surface 102s of the epitaxial stack 102 may be air to perfect the heat dissipating effect, and then the matrix electrode structure 103 can be called an air-bridge matrix (ABM) electrode structure. However, air used to be the medium is not limitation. In other embodiment, an insulating layer can be arranged on the surface of the epitaxial stack and the first and second bridges are disposed on the insulating layer, wherein the insulating layer may be a heat dissipating material, like $SiO_2$ (not shown).

In FIGS. 2B and 2C, the matrix electrode structure 103 further comprises a plurality of first fingers 10312, a plurality of second fingers 10322, a plurality of third fingers 10332, wherein the material of the plurality of first fingers 10312 are the same as the first electrodes 10331, the material of the plurality of second fingers 10322 are the same as second electrodes 10321, and the material of the plurality of the third fingers 10332 are the same as the third electrodes 10331. The plurality of first fingers 10312 extends from the first electrode 10311f, and the first finger 10312a electrically connects with the first electrode 10311f and the first pad 10313 (as shown in FIG. 2B). The plurality of second fingers 10322 extends from the second electrode 10321e, and the second finger 10322a electrically connects with the second electrode 10321e and the second pad 10323 (as shown in 2C). The plurality of third fingers 10332 extends from the third electrode 10331e, and the third finger 10332a electrically connects with the third electrode 10331e and the third pad 10333. Especially, a length of the first fingers 10312a is longer than that of the second fingers 10322b and that of the third fingers 10332b, the first finger 10312a surrounds the second finger 10322b and the third finger 10332b, and the first finger 10312a is arranged between the second finger 10322b and the third finger 10332b and nearer the third finger 10332b than the second finger 10322b. Moreover, the second fingers 10322 extend from a first edge 1032110 in a vertical direction and the third fingers 10332 extend from a second edge 1033110 in a vertical direction. In the present embodiment, the matrix electrode structure and the bridges are used in order to increase the electrically and thermally conductive area and then decrease the drain-source on-resistance ($R_{DS}$_on), enhance the current density, and better current spreading.

Although the high-electron mobility transistor of the first embodiment has been described above, the present disclosure is not limited to the first embodiment.

Figure 3:
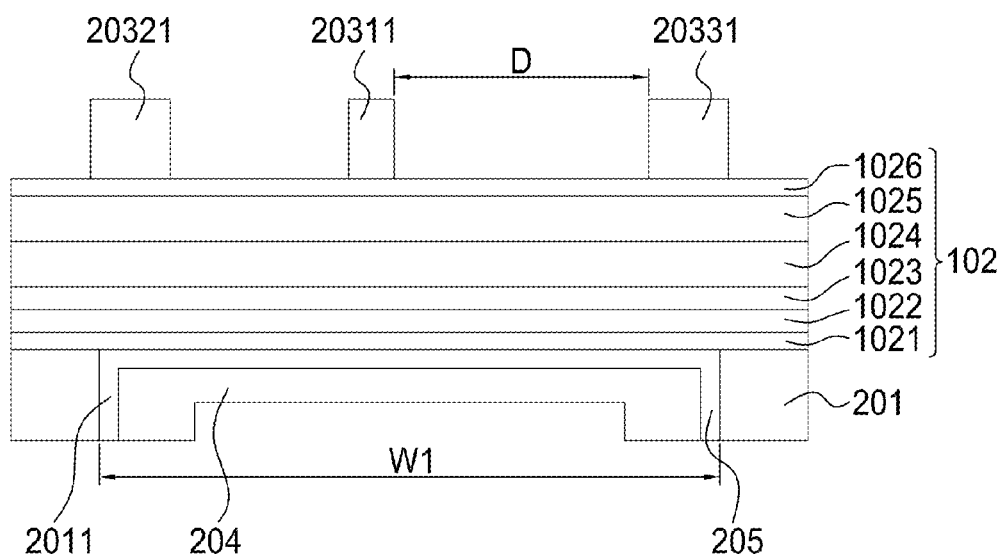
FIG. 3 shows a high-electron mobility transistor in accordance with a second embodiment of the present disclosure.

FIG. 3 shows a small FET (field effect transistor) in accordance with a second embodiment of the present disclosure. In the second embodiment, the small FET structure of the second embodiment is similar to that of the first embodiment, except that the small FET 20 further comprises a concave region 2011 disposed below the first region 102A. Especially, the concave region 2011 is arranged between the first electrode 10311 and the third electrode 10331 to prevent the occurrence of the leakage path and disposed within the substrate 201. A conductive layer 204 is formed in the concave region 2011, and an insulating layer 205 is arranged between the substrate 201 and the conductive layer 204 and between the epitaxial stack 102 and the conductive layer 204. The insulating layer 205 can directly contact the epitaxial stack 102. The high-electron mobility transistor 200 with the conductive layer 204 and the insulating layer 205 is capable of improving the mechanical strength of the device and enhancing the heat dissipating effect and the breakdown voltage. In the present embodiment, a distance between the first electrode 20311 and the third electrode 20331 is D1, and a width of the concave region 2011 is W1, wherein W1 is larger than the D1 to prevent the occurrence of the leakage path and to raise the breakdown voltage. In other embodiments, W1 may be smaller than or equal to D1. The conductive layer 204 comprises a metal material, such as Cu, wherein a thickness of the conductive layer 204 is larger than 0.1 μm. The insulating layer 205 comprises $SiO_2$ with a thickness larger than 50 nm. In other embodiment, the substrate can be entirely removed, the conductive layer may be disposed below the epitaxial layer, and the insulating layer may be disposed between the epitaxial layer and the conductive layer and directly contact the epitaxial stack.

Figure 4A:
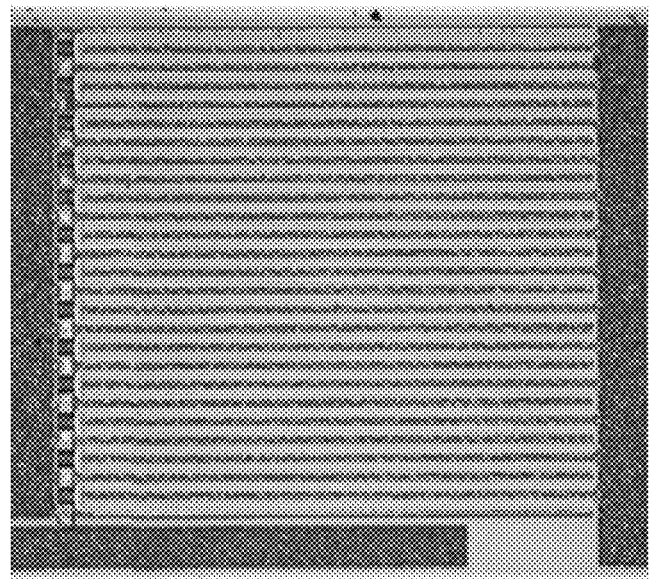
FIGS. 4A~4D are photos of samples A~C in accordance with an experiment of the present disclosure.
Figure 4B:
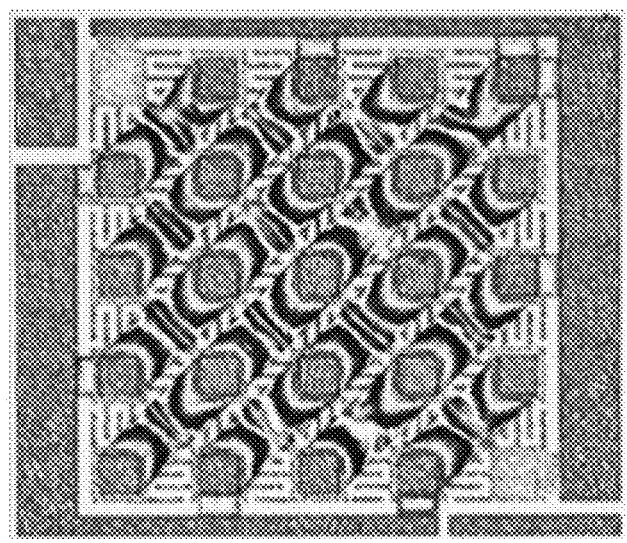
Figure 4C:
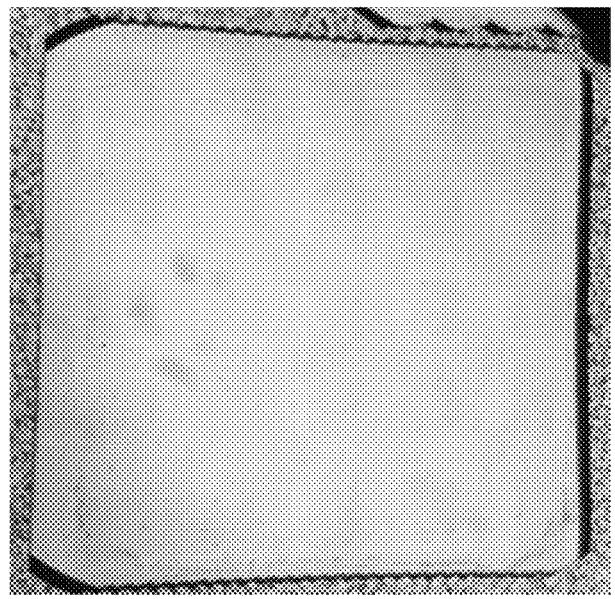
Figure 4D:
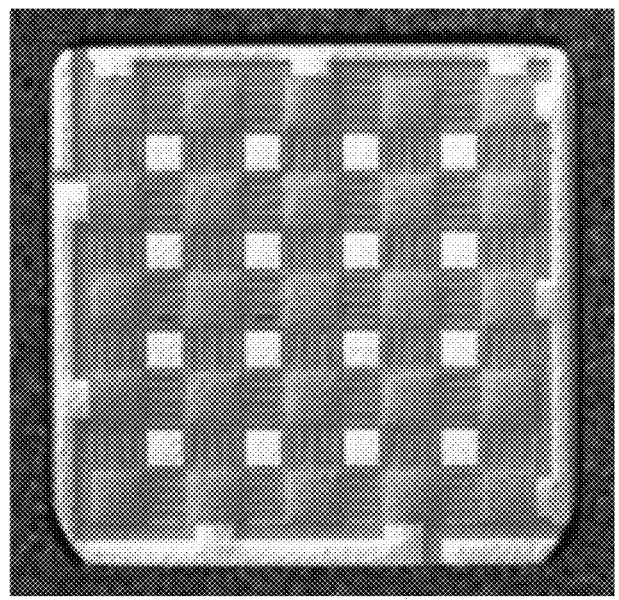

Table 1 shows an experimental result of samples A~C in different electrode structures and substrate structure, wherein the gate width (Wg) is a sum of the finger length of gate electrode. As shown in FIGS. 4A~4D, the sample A comprises a traditional multi-finger (MF) electrode structure with a gate width of 40 mm, the sample B comprises an air-bridge matrix (ABM) electrode structure with a gate width of 22.8 mm, and the sample C comprises an air-bridge matrix (ABM) electrode structure with a gate width of 22.8 mm while the substrate is removed (as shown in FIG. 4D) and 300 nm $SiO_2$ and 20 μm Cu is disposed below the epitaxial stack (as shown in FIG. 4C), wherein the active region of samples A~C is 1.5625 mm² (1.25 mm×1.25 mm).

TABLE 1

| Sample | Device Structure | Wg (mm) | Area (mm2) | Current $I_{DS}$ (A) | $R_{DS\_on}$ (Ω) | $V_{BR}$ (V) |
|---|---|---|---|---|---|---|
| Sample A | MF electrode with 100 μm Si substrate | 1.25 × 32 = 40 | 1.25 × 1.25 = 1.5625 | 2.1 | 2 | 486 |
| Sample B | ABM electrode with 100 μm Si substrate | 22.8 | 1.5625 | 4.7 | 0.73 | 532 |
| Sample C | ABM electrode with substrate removed, 300 nm SiO₂ and 20 μm Cu | 22.8 | 1.5625 | 4.81 | 0.69 | 659 |

Figure 5A:
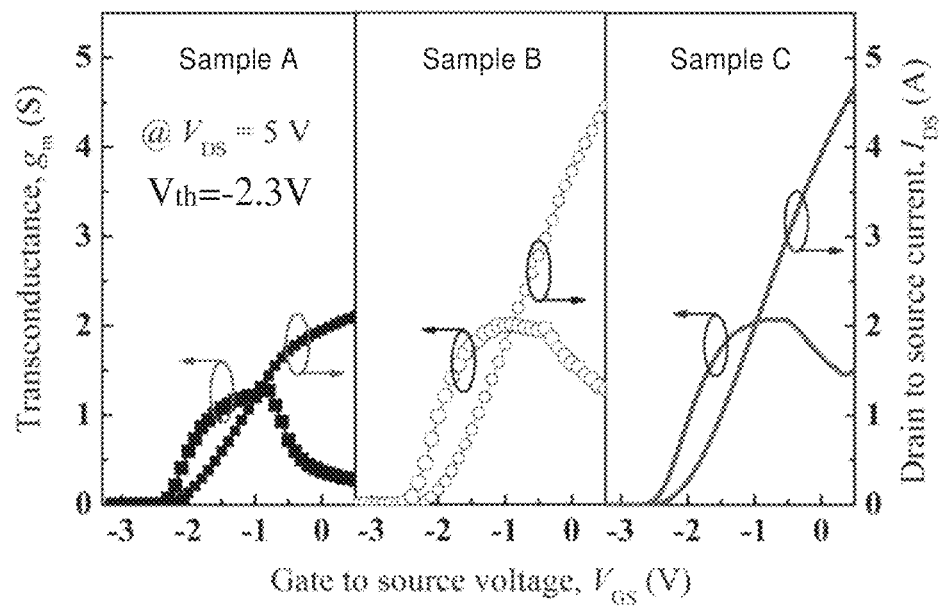
FIG. 5A shows $I_{DS}$-$V_{GS}$ and gm-$V_{GS}$ characteristics of samples A~C in accordance with an experiment of the present disclosure.

FIG. 5A shows $I_{DS}$-$V_{GS}$ characteristics of the present experiment, wherein sample C obtains the highest current ($I_{DS}$) of 4.81A while operating voltage $V_{DS}$ is 5V and $V_{GS}$ is from −3V to 1V. The current direction is one-dimensional in sample A because of the multi-finger (MF) electrode structure and the current direction is two-dimensional in sample B because of the air-bridge matrix (ABM) electrode structure. A substantial improvement of current intensity is observed comparing sample A with sample B because the current density of sample B is increased from one-dimensional to two-dimensional. Moreover, the $I_{DS}$ of sample C can be improved to 4.81A comparing with the $I_{DS}$ of sample B of 4.7A because the substrate is removed. The threshold voltage of all of samples A~C is −2.3 V.

Figure 5B:
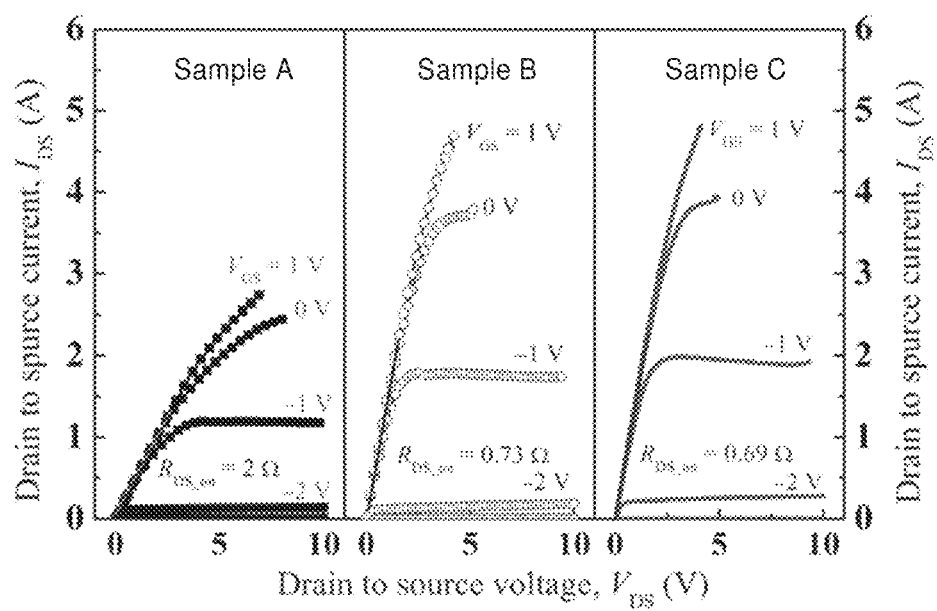
FIG. 5B shows $I_{DS}$-$V_{DS}$ characteristics of samples A~C in accordance with an experiment of the present disclosure.

FIG. 5B shows $I_{DS}$-$V_{DS}$ characteristics of the present experiment with $V_{GS}$ from 1V to −3V. The $R_{DS}$ on can be extracted while $V_{GS}$ was 0 V. The lower $R_{DS}$ on of sample B is ascribed to the improved current density and less current crowding of sample B. The current flow of sample A is one-dimensional, and the current crowding occurs at the drain electrode due to high electric field. However, the current flow of sample B is two-dimensional, and the current can be distributed and current crowding can be reduced. Then, the $R_{DS}$ on of sample C was lower than the sample B because the substrate is removed and the heat dissipating is improved.

Figure 5C:
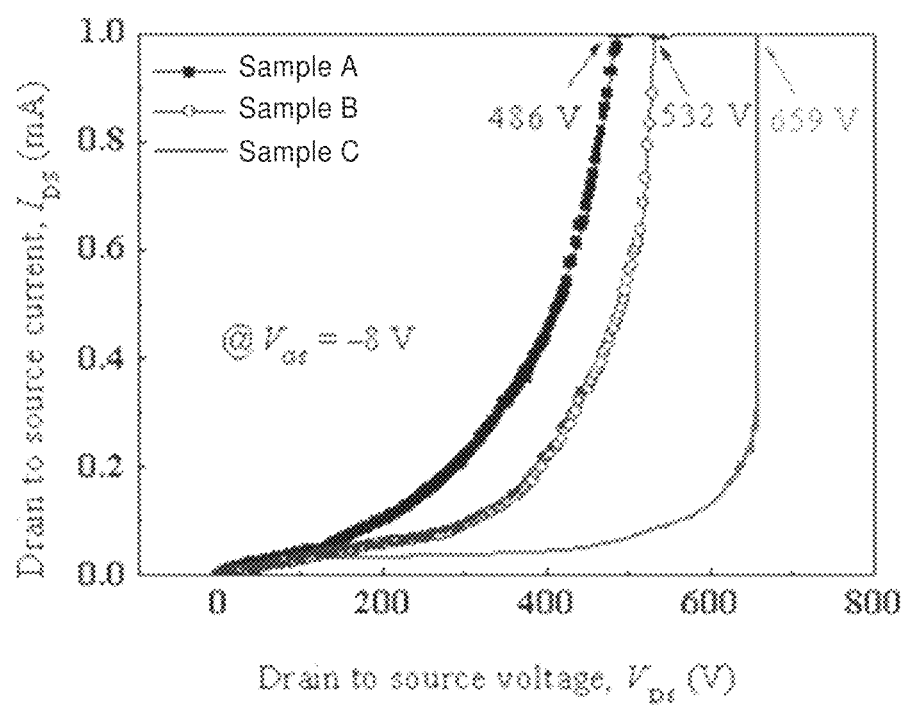
FIG. 5C shows the off-state breakdown characteristics of samples A~C in accordance with an experiment of the present disclosure.

FIG. 5C shows the off-state breakdown characteristics according to the present experiment, wherein the operating voltage $V_{GS}$ is −8V and $V_{DS}$ is from 0V to 800V. The off-state breakdown voltage ($V_{BR}$) was defined as the voltage at which a leakage current of 1 mA flowed between source and drain electrode. The sample C presents a highest $V_{BR}$ 659V.

Figure 6A:
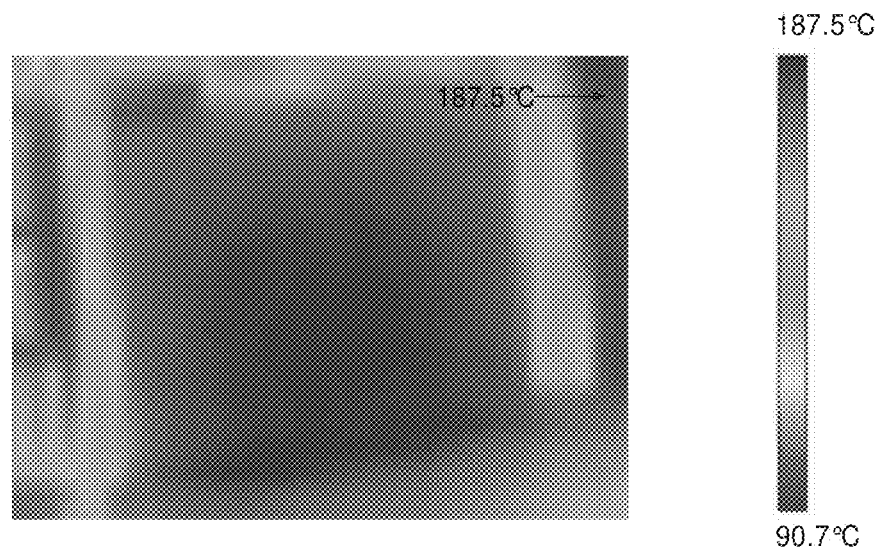
FIGS. 6A~6C show the thermal images of samples A~C in accordance with an experiment of the present disclosure.
Figure 6B:
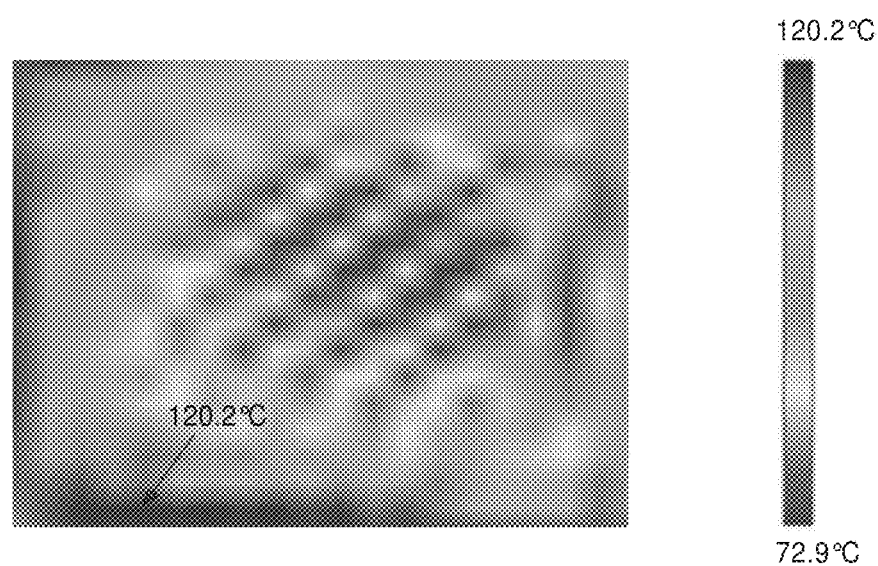
Figure 6C:
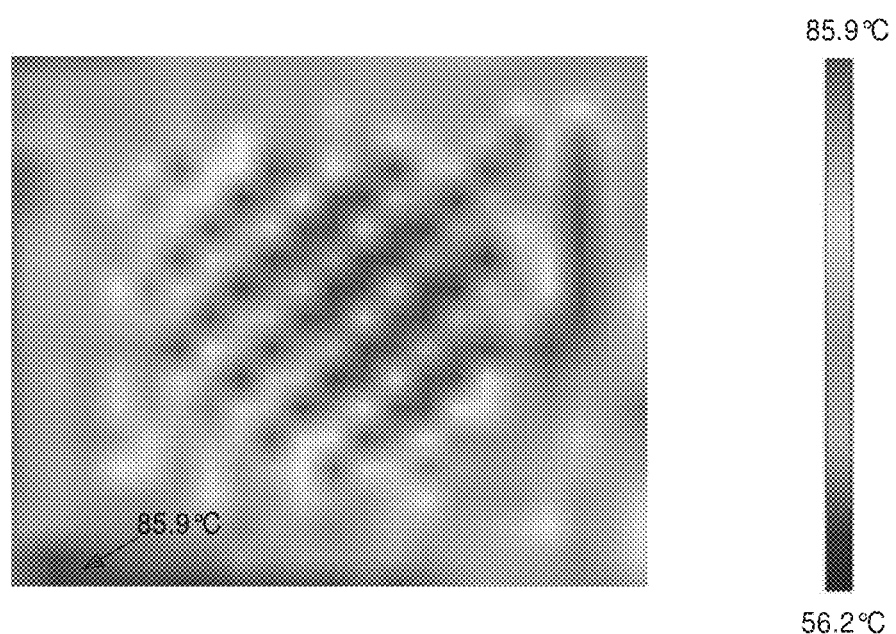

FIGS. 6A~6C show the thermal images of samples A~C, wherein the $V_{DS}$ is 5 V, drain current is limited at 1 A, and continuous time is 1 minute. The temperature of drain electrode of sample A with 100 μm Si substrate is 187.5° C. The temperature of drain electrode of sample B with 100 μm Si substrate was reduced to 120.2° C. It is because the heat dissipation of the air-bridge matrix (ABM) electrode structure is better than the traditional multi-finger (MF) electrode structure. The temperature can be further reduced to 85.9° C. by using the air-bridge matrix (ABM) electrode structure with the substrate removed. It can be proved that the air-bridge matrix (ABM) electrode structure with the substrate removed significantly eliminates the self-heating effect which $V_{DS}$ at high voltage.

It should be noted that the proposed various embodiments are not for the purpose to limit the scope of the disclosure. Any possible modifications without departing from the spirit of the disclosure may be made and should be covered by the disclosure.

The invention claimed is:

1. A high electron mobility transistor, comprising:
   a substrate;
   an epitaxial stack arranged above the substrate and having a first region and a second region surrounding the first region;
   a matrix electrode structure arranged in the first region comprising a plurality of first electrodes arranged on the epitaxial stack;
   a plurality of second electrodes arranged on the epitaxial stack and adjacent to the plurality of first electrodes;
   a plurality of third electrodes arranged adjacent to the plurality of first electrodes and second electrodes;
   a plurality of first bridges electrically connecting the plurality of second electrodes, wherein one of the bridges is arranged between two of the second electrodes and crossed over one of the first electrodes; and
   a plurality of second bridges electrically connecting the plurality of third electrodes.

2. The high electron mobility transistor of claim 1, wherein the matrix electrode structure further comprises a plurality of first fingers extending from one of the first electrodes.

3. The high electron mobility transistor of claim 2, further comprising a first pad arranged in the second region, wherein one of the first fingers electrically connects with the one of the first electrode and the first pad.

4. The high electron mobility transistor of claim 2, wherein the matrix electrode structure further comprises a plurality of second fingers extending from one of the second electrodes.

5. The high electron mobility transistor of claim 4, wherein the second electrode comprises a first edge and the plurality of second fingers extending from the first edge along a vertical direction.

6. The high electron mobility transistor of claim 4, wherein one of the first fingers surrounds one of the second fingers.

7. The high electron mobility transistor of claim 4, wherein a length of one of the first fingers is longer than that of one of the second fingers.

8. The high electron mobility transistor of claim 4, further comprising a second pad arranged in the second region, wherein one of the second fingers electrically connects with the one of the second electrode and the second pad.

9. The high electron mobility transistor of claim 1, wherein one of the second bridges is arranged between two of the third electrodes and crosses over one of the first electrodes.

10. The high electron mobility transistor of claim 1, wherein the matrix electrode structure further comprises a plurality of first fingers extending from one of the first electrodes and/or a plurality of third fingers extending from one of the third electrodes.

11. The high electron mobility transistor of claim 10, further comprising a third pad arranged in the second region, wherein one of the third fingers electrically connects with one of the third electrode and the third pad.

12. The high electron mobility transistor of claim 11, wherein the third electrode comprises a second edge and the plurality of third fingers extending from the second edge in a vertical direction.

13. The high electron mobility transistor of claim 10, wherein one of the first fingers surrounds one of the third fingers.

14. The high electron mobility transistor of claim 1, wherein more than two first electrodes form a geometric shape surrounding one of the second electrode or the third electrode.

15. The high electron mobility transistor of claim 1, wherein the plurality of first electrodes and the plurality of second electrodes or the plurality of third electrodes are disposed in different columns or lines.

16. The high electron mobility transistor of claim 1, wherein the plurality of first electrodes is gate electrode, the plurality of second electrodes is source electrode, and the plurality of third electrodes is drain electrode.

17. The high electron mobility transistor of claim 1, wherein the substrate comprises a concave region disposed below the first region.

18. The high electron mobility transistor of claim 17, further comprising a conductive layer arranged in the concave region and an insulating layer arranged between the conductive layer and the substrate.

* * * * *